United States Patent
Shentu et al.

(10) Patent No.: US 10,333,019 B2
(45) Date of Patent: Jun. 25, 2019

(54) PACKAGE STRUCTURE OF LIGHT EMITTER AND LIGHT SENSOR WITH LIGHT-BLOCKING LAYER AND METHOD FOR MANUFACTURING THE SAME

(71) Applicant: Silergy Semiconductor Technology (Hangzhou) Ltd., Hangzhou (CN)

(72) Inventors: Junli Shentu, Hangzhou (CN); Jiaming Ye, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/604,992

(22) Filed: May 25, 2017

(65) Prior Publication Data
US 2017/0345961 A1    Nov. 30, 2017

(30) Foreign Application Priority Data

May 27, 2016 (CN) .......................... 2016 1 0367262

(51) Int. Cl.
*H01L 31/167* (2006.01)
*H01L 31/0216* (2014.01)
(Continued)

(52) U.S. Cl.
CPC .......... *H01L 31/167* (2013.01); *G01J 1/0209* (2013.01); *G01J 1/0214* (2013.01);
(Continued)

(58) Field of Classification Search
CPC ...... G01J 1/4204; G01J 1/0488; G01J 1/0214; H01L 31/0203; H01L 31/02165;
(Continued)

(56) References Cited

U.S. PATENT DOCUMENTS 9,024,403 B2 *    5/2015    Park ................. H01L 27/14618
                                                           250/208.1
9,054,088 B2     6/2015    Tan
(Continued)

FOREIGN PATENT DOCUMENTS

CN          101546737 A        9/2009
CN          201440413 U *      4/2010    ............. H01L 25/00
(Continued)

OTHER PUBLICATIONS

Machine translation, portion of Chen, Chinese Pat. Pub. No. CN 201440413U, translation date: Aug. 24, 2018, Google Translate, all pages.*

(Continued)

*Primary Examiner* — Victoria K. Hall
(74) *Attorney, Agent, or Firm* — Westman, Champlin & Koehler, P.A.

(57) ABSTRACT

A package structure and a method for manufacturing the same are disclosed. The package structure includes a first plastic body which covers a first light sensor and a light emitter, and a second plastic body which is made of infrared cutoff materials and fills inner pins of a lead frame or is formed below the lead frame. A trench is formed in the first plastic body so that a light-blocking layer is located on a side surface of the first plastic body. The second plastic body and the light-blocking layer are used to avoid influence of infrared light on a first light sensor.

23 Claims, 8 Drawing Sheets

(51) Int. Cl.
*H01L 31/0203* (2014.01)
*H01L 31/02* (2006.01)
*H01L 31/18* (2006.01)
*G01J 5/10* (2006.01)
*G01J 1/42* (2006.01)
*G01J 1/02* (2006.01)
*G01J 1/04* (2006.01)
*H01L 31/00* (2006.01)

(52) U.S. Cl.
CPC ............ *G01J 1/0271* (2013.01); *G01J 1/0488* (2013.01); *G01J 1/4204* (2013.01); *G01J 5/10* (2013.01); *H01L 31/00* (2013.01); *H01L 31/0203* (2013.01); *H01L 31/02005* (2013.01); *H01L 31/02165* (2013.01); *H01L 31/18* (2013.01)

(58) Field of Classification Search
CPC ........... H01L 31/2164; H01L 27/14652; H01L 27/1645; H01L 27/14649; H01L 27/1465; H01L 27/14667; H01L 27/14669; H01L 27/1467
See application file for complete search history.

(56) References Cited

U.S. PATENT DOCUMENTS

| | | |
|---|---|---|
| 9,136,207 B2 | 9/2015 | Tan |
| 9,595,453 B2 | 3/2017 | Tan et al. |
| 2002/0001778 A1* | 1/2002 | Latchford ............... G03F 7/091 430/313 |
| 2008/0006762 A1 | 1/2008 | Fadell et al. |
| 2013/0292706 A1* | 11/2013 | Costello ................ H01L 31/167 257/82 |
| 2015/0201114 A1* | 7/2015 | Shin ......................... G03B 3/02 348/375 |
| 2015/0249068 A1 | 9/2015 | Ye |
| 2016/0116653 A1* | 4/2016 | Murayama ........ H01L 27/14618 359/359 |
| 2016/0351483 A1 | 12/2016 | Ye |
| 2017/0141241 A1* | 5/2017 | Yu ......................... G01J 1/0209 |

FOREIGN PATENT DOCUMENTS

| | | |
|---|---|---|
| CN | 201440413 U | 4/2010 |
| CN | 103000608 A | 3/2013 |
| CN | 103021989 A | 4/2013 |
| CN | 203721707 U | 7/2014 |
| CN | 104409369 A | 3/2015 |
| CN | 104916599 A | 9/2015 |
| CN | 105097571 A | 11/2015 |

OTHER PUBLICATIONS

English translation, Li, Chinese Pat. Pub. No. CN 201410413, translation date: Dec. 2018, LinguaLinx Language Solutions, Inc., all pages. (Year: 2018).*

Office Action, including Search Report, for Chinese Patent Application No. 201610367262.0, dated Apr. 4, 2018, 10 pages.

* cited by examiner

Prior Art

PACKAGE STRUCTURE OF LIGHT EMITTER AND LIGHT SENSOR WITH LIGHT-BLOCKING LAYER AND METHOD FOR MANUFACTURING THE SAME

CROSS-REFERENCE TO RELATED APPLICATION

This application claims the benefit of Chinese Patent Application No. 201610367262.0, filed on May 27, 2016, which is incorporated herein by reference in its entirety.

BACKGROUND OF THE DISCLOSURE

Field of the Disclosure

The present disclosure relates to a package structure and a method for manufacturing the same, and more particularly, to a package structure having a light sensor and a method for manufacturing the same.

Background of the Disclosure

In a device such as a notebook computer and a mobile phone, various light sensors are generally used. Ambient light sensors can detect the brightness of ambient light and automatically adjust backlight luminance of the display based on it, in order to reduce power consumption. Therefore, energy-saving and intelligence of the products are realized. Proximity sensors can detect the action that a user puts a phone mobile close to ear and begins to make a phone call, at the occasion, the backlight module in the mobile phone can be turned off, for saving energy and preventing misoperation.

Figure 1:
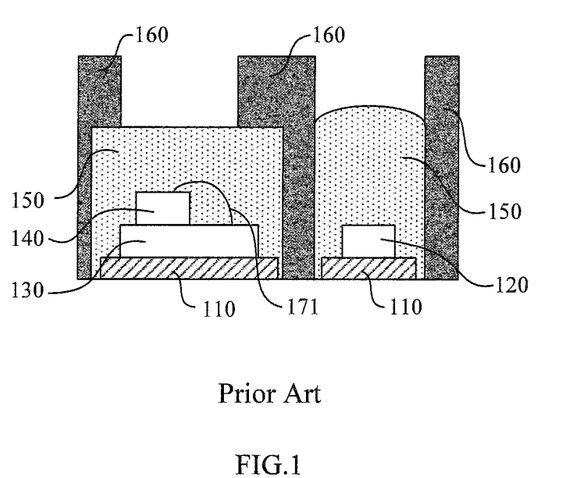
FIG. 1 is a cross-sectional diagram of a package structure according to the prior art.

When an ambient light sensor and a proximity sensor are used in an electronic product, the proximity sensor is generally an infrared light sensor which needs to receive the infrared light reflected, and the ambient light sensor needs to avoid the interference of the infrared light as possible to make the determination result of the ambient light sensor to the brightness of the ambient light close to the human eyes. Ambient light sensors, infrared light sensors and infrared light emitters are generally independent devices in the conventional electronic products, which increases manufacturing cost, and the resulting products including the sensors have large sizes. Therefore, the prior art begins to integrate the ambient light sensor, the infrared light sensor and the infrared light emitter into a package structure. The package structure, as shown in FIG. 1, an ambient light sensor 140 and an infrared light sensor 130 are mounted on the lead frame 110, for example, the electrodes of the ambient light sensor 140 and the infrared light sensor 130 are electrically coupled by a metal wire 171 to the lead frame 110, an infrared light emitter 120 is mounted on the lead frame 110, the electrodes of the infrared light emitter 120 are placed on the lead frame 110 and welded to the lead frame 110; then a first plastic package is performed to form a transparent first plastic body 150 covering the infrared light emitter 120, the infrared light sensor 130 and the ambient light sensor 140; then the first plastic body 150 is cut and divided into two portions; and finally a second plastic package is performed to form a second plastic body 160 isolated from the infrared light, the second plastic body 160 covers the two portions of the whole of first plastic body 150 and has two openings for respectively exposing parts of the first plastic body 150 so that it is convenient for the infrared light emitter 120 to emit infrared light, the ambient light sensor 140 to receive ambient light and the infrared light sensor 130 to receive infrared light being reflected.

However, in order to improve the convenience of notebook computers, mobile phones and other equipments, it is desired to further reduce the size of the package structure.

SUMMARY OF THE DISCLOSURE

In view of the above problems, an objective of the disclosure is to provide a package structure and a method for manufacturing the same, to ensure the anti-interference capability of the light sensor and reduce the size.

According to one aspect of the disclosure, the package structure comprises a lead frame; a first light sensor being electrically coupled to the lead frame; a light emitter separated from the first light sensor and being electrically coupled to the lead frame; a first plastic body in which a trench is formed; and a light-blocking layer located on a side surface of the first plastic body, wherein the first plastic body is divided by the trench into a first portion covering the light emitter and a second portion covering the first light sensor, the first portion of the first plastic body has the side surface facing the first light sensor.

Preferably, the package structure further comprises a second light sensor being electrically coupled to the lead frame.

Preferably, the first light sensor is an ambient light sensor, on which an ambient light sensing region is provided to detect ambient light; and the second light sensor is an infrared light sensor, on which an infrared light sensing region is provided to detect infrared light.

Preferably, the first plastic body is a transparent plastic body; and the light-blocking layer is an infrared light-blocking layer that prevents infrared light from passing through.

Preferably, a first filter film is provided on the ambient light sensing region of the ambient light sensor, which is an infrared cutoff filter film.

Preferably, a second filter film is provided on the infrared light sensing region of the infrared light sensor, which allows only infrared light to pass through.

Preferably, the portions of the first plastic body on the ambient light sensor, the infrared light sensor, and the infrared light emitter may optionally have convex surfaces.

Preferably, the package structure further comprises: a second plastic body made of infrared cutoff materials and covering the rest portion of the infrared light sensor except for the infrared light sensing region.

Preferably, the lead frame comprises: a plurality of inner pins being coupled to the first light sensor and the light emitter; and a plurality of outer pins being exposed outside the first plastic body.

Preferably, the package structure further comprises: a third plastic body, wherein there are gaps between the plurality of inner pins, and the gaps are filled with the third plastic body.

Preferably, the third plastic body is made of infrared cutoff materials.

According to the other aspect of the disclosure, there is provided a method for manufacturing a package structure, comprising:
providing a lead frame; mounting a first light sensor and a light emitter which are mounted separately but are both electrically coupled to the lead frame; forming a first plastic body which covers all or part of the first light sensor and the light emitter; forming a trench in the first plastic body, wherein the first plastic body is divided by the trench into a first portion covering the light emitter and a second portion covering the first light sensor, the first portion of the first plastic body has a side surface facing the first light sensor; forming a light light-blocking layer on the side surface.

Preferably, the method further comprises:
mounting a second light sensor being electrically coupled to the lead frame.

Preferably, the second light sensor is mounted while the first light sensor and the light emitter are mounted.

Preferably, the second light sensor is mounted on the first light sensor.

Preferably, the second light sensor is mounted after the first plastic body is formed.

Preferably, a second plastic body is formed covering the second light sensor after the second light sensor is mounted. When the first plastic body is cut, the second plastic body is cut or not.

Preferably, the step of forming the first plastic body comprises forming convex surfaces over the first light sensor and the light emitter.

Preferably, the electric coupling is implemented by coupling electrodes of the first light sensor or the second light sensor or the light emitter to inner pins of the lead frame via electric connectors.

Preferably, the electric coupling is implemented by placing electrodes of the first light sensor or the second light sensor or the light emitter on inner pins of the lead frame and welding to the inner pins.

Preferably, the electric coupling between the second light sensor and the lead frame is implemented by conductive vias provided on the first light sensor.

Preferably, wherein the materials of the first plastic body are filled between the light-blocking layer and the second portion of first plastic body to form a complete first plastic body.

The package structure and method for manufacturing the same according to the disclosure comprise mounting a light-blocking layer between the light emitter and the light sensor, so as to prevent the light with a specific wavelength from passing through and avoid the influence to the normal operation of the light sensor, and thus the anti-interference capacity of the light sensor is ensured and the size of package structure is reduced while the light sensor is integrated.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Exemplary embodiments of the present disclosure will be described in more detail below with reference to the accompanying drawings. In the drawings, like reference numerals denote like members. The figures are not drawn to scale, for the sake of clarity. Moreover, some well-known parts may not be shown.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential, but can be varied in a specific implementation of the disclosure.

Hereinafter, the process of packaging an ambient light sensor, an infrared light sensor and an infrared light emitter are used as an example to describe a package structure and method for manufacturing the same, where the ambient light sensor and infrared light sensor can be exchanged in their positions.

Figure 2A:
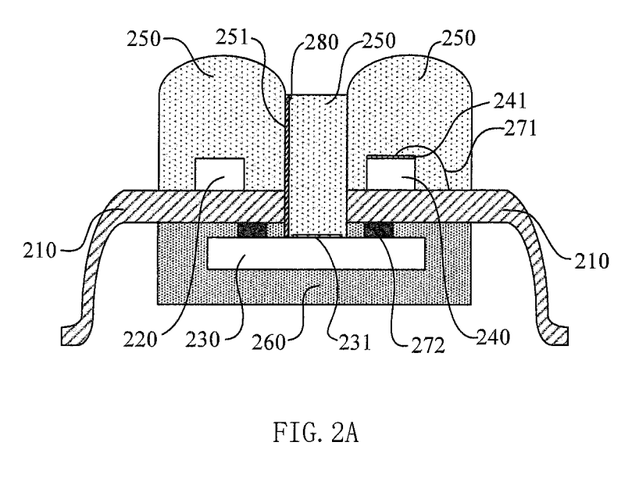
FIG. 2A is a cross-sectional diagram of a package structure according to a first embodiment.
Figure 2B:
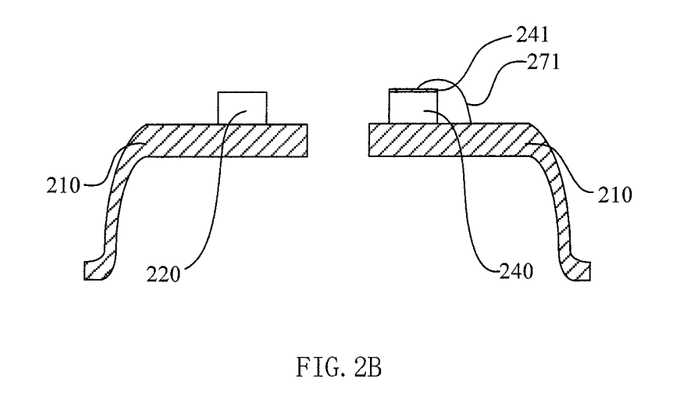
FIG. 2B to 2F are cross-sectional diagrams of the structure corresponding to various steps of a method for manufacturing the structure package according to the first embodiment.

FIG. 2A is a cross-sectional diagram of a package structure according to a first embodiment of the disclosure. In the embodiment, the package structure includes a lead frame 210 having inner pins and outer pins. The inner pins are used for electric coupling of the inner components in the package structure, the outer pins are used for electric coupling of the package structure with the external devices, which are exposed outside the package structure after the packaging is completed. In the embodiment, the lead frame has a first surface and a second surface. An infrared light emitter 220 and an ambient light sensor 240 are located on the first surface of the lead frame 210 and separated at a distance, the infrared light emitter 220 is an infrared LED lamp, the ambient light sensor 240 is electrically coupled to the inner pins of the lead frame 210 by a metal wire 271, electrodes of the infrared light emitter 220 are placed on the inner pins of the lead frame 210 and welded to the lead frame 210. In order to effectively detect the brightness of ambient light, the ambient light sensor 240 has an ambient light sensing region on which a first filter film 241 is provided. The first filter film 241 is an infrared light filter film for avoiding the influence of the infrared light on the ambient light sensor 240, which may be emitted by the infrared light emitter 220 or reflected.

An infrared light sensor 230 is located on a second surface of the lead frame 210, including an infrared light sensing region which is not blocked by the lead frame 210, the infrared light sensor 230 is electrically coupled to the inner pins of the lead frame 210 via the electric connector 272. A second filter film 231 is provided on the infrared light sensing region of the infrared light sensor 230, and only infrared light is allowed to pass through the second filter film 231. A first plastic body 250 covers the whole of the infrared light emitter 220, the whole of the ambient light sensor 240 and parts of the infrared light sensor 230, the part of the first plastic body 250 covering the infrared light emitter 220 has a side surface 251 facing the ambient light sensor 240 and/or the infrared light sensor 230, a light-blocking layer 280 is provided on the side surface 251. In the embodiment, the light-blocking layer 280 is an infrared light-blocking layer for blocking infrared light to pass through, so that infrared light from the infrared light emitter 220 can not directly pass through the side surface 251, and thus avoids the interference to the ambient light sensor 240 and/or infrared light sensor 230 in actual operation. The portions of the first plastic body 250 on the ambient light sensor 240 and the infrared light emitter 220 have convex surfaces, which are served as optical lens, to facilitate the divergence of the infrared light emitted by the infrared light emitter 220 and aggregation of the light received by the ambient light sensor 240, thereby expanding the detection range. A second plastic body 260 is provided on the second surface of the lead frame 210, the second plastic body 260 is made of infrared cutoff materials and covers a portion of the infrared light sensor 230 and exposes the infrared light sensing region. In this way, the interference of the unwanted infrared light on the infrared light sensor 230 is avoided.

FIG. 2B to 2F are cross-sectional diagrams of the structure corresponding to various steps of a method for manufacturing the structure package according to the first embodiment. As referring to FIG. 2B, firstly, there is provided the lead frame 210 having a first surface and a second surface, the infrared light emitter 220 and the ambient light sensor 240 are mounted separately on the first surface of the lead frame 210, the electrodes of the infrared light emitter 220 are placed on the inner pins of the lead frame 210, and welded to the lead frame 210, the ambient light sensor 240 is electrically coupled to the inner pins of the lead frame 210 via the metal wire 271. In order to effectively detect the brightness of ambient light, the first filter film 241 is provided on the ambient light sensing region of the ambient light sensor 240, the first filter film 241 is an infrared cutoff filter film.

Figure 2C:
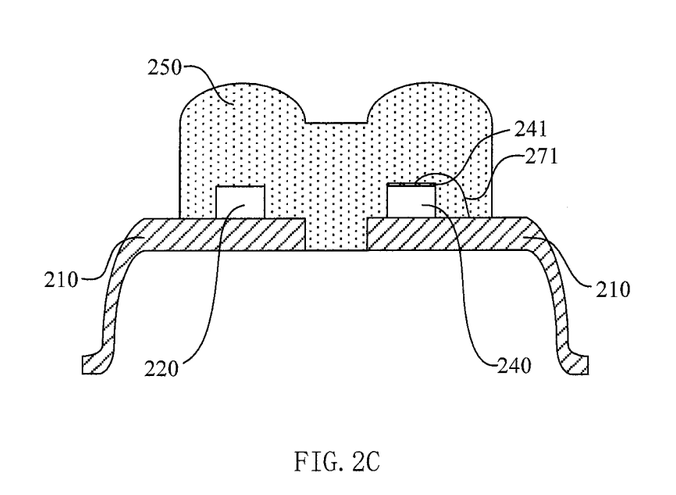

Next, as referring to FIG. 2C, the first plastic body 250 is formed, which is selected from a group of transparent plastic bodies, a mould of special shape is used to form the first plastic body 250 covering the infrared light sensor 220 and the ambient light sensor 240, so that the first plastic body 250 has convex surfaces on the infrared light emitter 220 and the ambient light sensor 240.

Figure 2D:
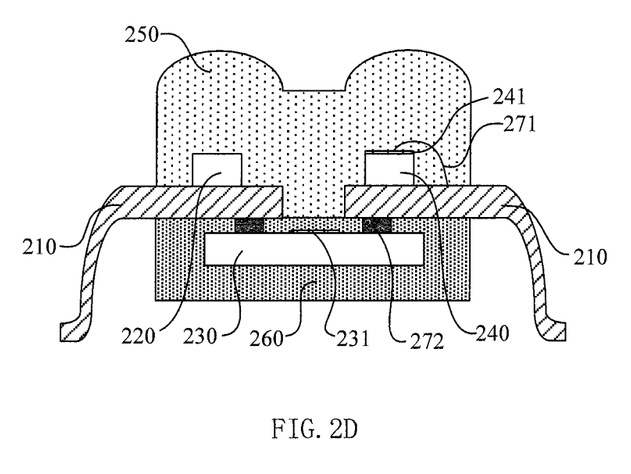

Next, as referring to FIG. 2D, the infrared light sensor 230 is electrically coupled to the second surface of the lead frame 210 via the electric connector 272, the infrared light sensor 230 includes the infrared light sensing region on which the second filter film 231 is provided, the second filter film 231 only allows infrared light to pass through, and the infrared light sensing region of the infrared light sensor 230 is not blocked by the lead frame 210. Next, a second plastic package is performed to form the second plastic body 260.

In the embodiment, the second plastic body 260 is made of infrared cutoff materials, which covers the infrared light sensor 230.

Figure 2E:
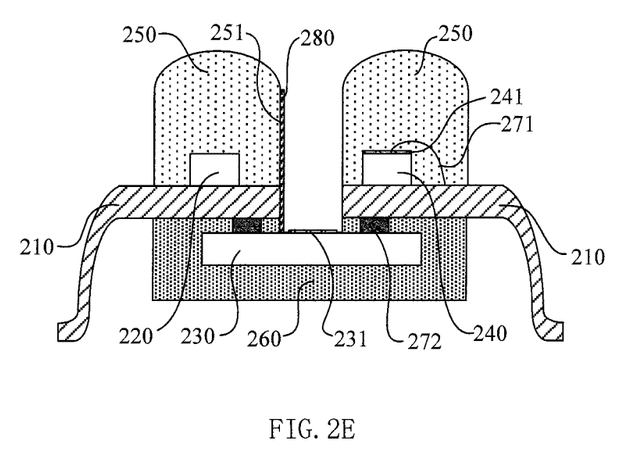

Next, as referring to FIG. 2E, a portion of the first plastic body 250 and a portion of the second plastic body 260 are removed to form a trench which exposes the infrared light sensing region of the infrared light sensor 230. The trench divides the first plastic body 250 into a first portion covering the infrared light emitter 220 and a second portion covering the ambient light sensor 240. The first portion has the side surface 251 facing the ambient light sensor 240 and/or the infrared light sensor 230. Then, the light-blocking layer 280 is formed by spraying the light-blocking materials on the side surface 251. In the embodiment, the light-blocking layer 280 is an infrared light-blocking layer which prevents infrared light from passing through, so that the infrared light from the infrared light emitter 220 will not directly pass through the side surface 251, which avoids the interference on the ambient light sensor 240 and/or infrared light sensor 230 in actual operations.

Figure 2F:
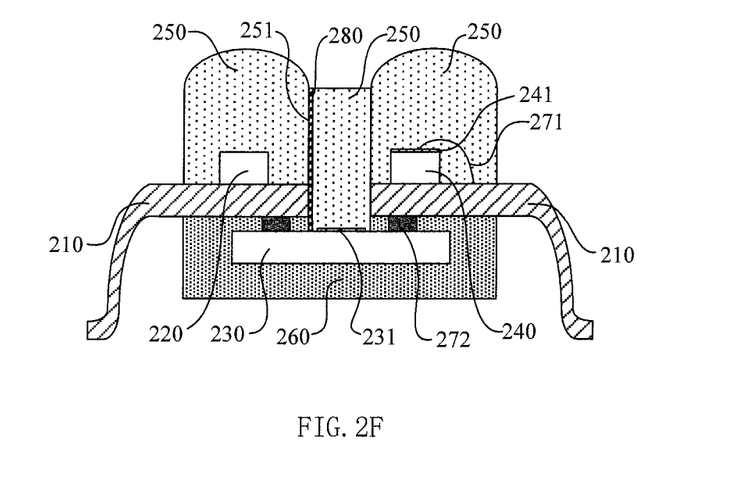

Finally, as referring to the FIG. 2F, the materials of the first plastic body 250 are filled between the light-blocking layer 280 and the second portion of the first plastic body 250, so as to form a complete first plastic body 250. With this, the manufacturing process for the package structure according to the first embodiment is accomplished.

Figure 3A:
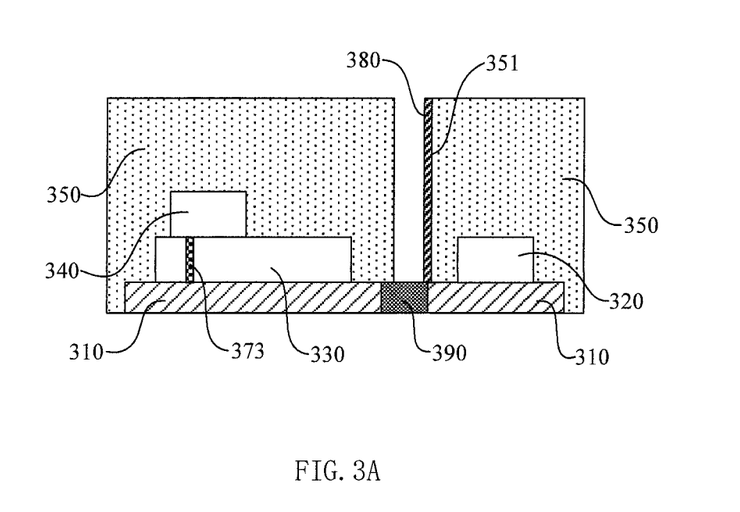
FIG. 3A is a cross-sectional diagram of an package structure according to a second embodiment.
Figure 3B:
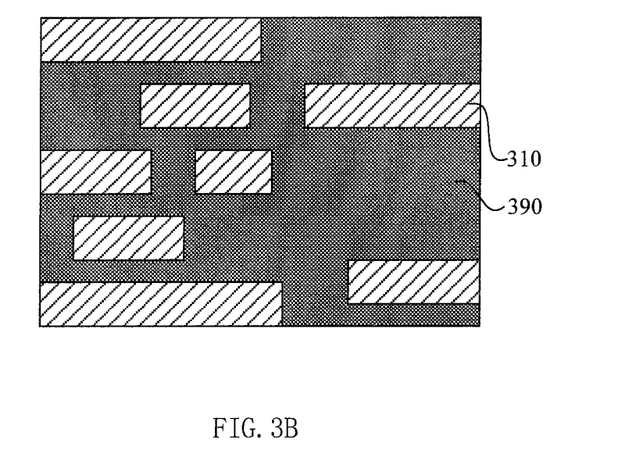
FIG. 3B is a top diagram of a lead frame in the package structure according to the second embodiment.

FIG. 3A is an sectional diagram of a package structure according to a second embodiment. In the embodiment, the package structure includes a lead frame 310. FIG. 3B is a top diagram of the lead frame 310 according to the embodiment. As referring to FIG. 3B, the inner pins of the lead frame 310 are stripe-like, and the outer pins are not shown. But in actual products, the outer pins are included in the lead frame 310. There are gaps between the stripe-like inner pins, which are filled with the infrared cutoff materials of the third plastic body 390. Next, as referring to the FIG. 3A, an infrared light emitter 320, an infrared light sensor 330 and an ambient light sensor 340 are located on the lead frame 310, the ambient light sensor 340 is mounted on the infrared light sensor 330 and they are separated at a distance from the infrared light emitter 320. The electrodes of the infrared light emitter 320 and the infrared light sensor 330 face the lead frame 310 and both are electrically coupled to the lead frame 310 by welding to the lead frame 310, whereas the ambient light sensor 340 is electrically coupled to the lead frame 310 by conductive vias 373 provided inside the infrared light sensor 330. The first plastic body 350 made of transparent plastic materials has two portions, one portion covers the infrared light emitter 320 and has a side surface 351 facing the ambient light sensor 340 and/or the infrared light sensor 330, the other portion covers the ambient light sensor 340 and the infrared light sensor 330, a light-blocking layer 380 is provided on the side surface 351, and the light-blocking layer 380 is an infrared light-blocking layer for blocking the infrared light to pass through.

Figure 3C:
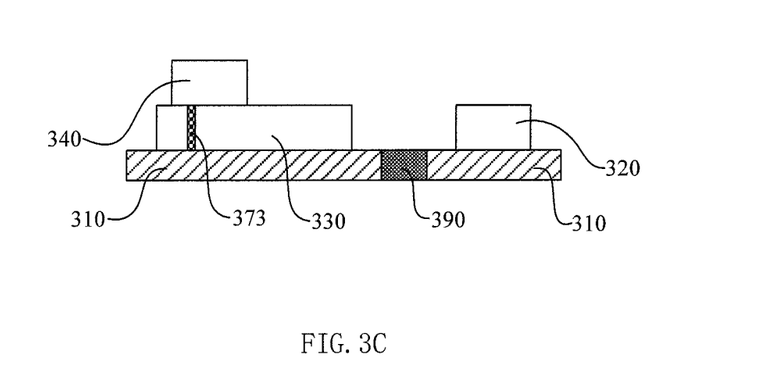
FIG. 3C to 3E are cross-sectional diagrams of the structure corresponding to various steps of a method for manufacturing the structure package according to the second embodiment.
Figure 3D:
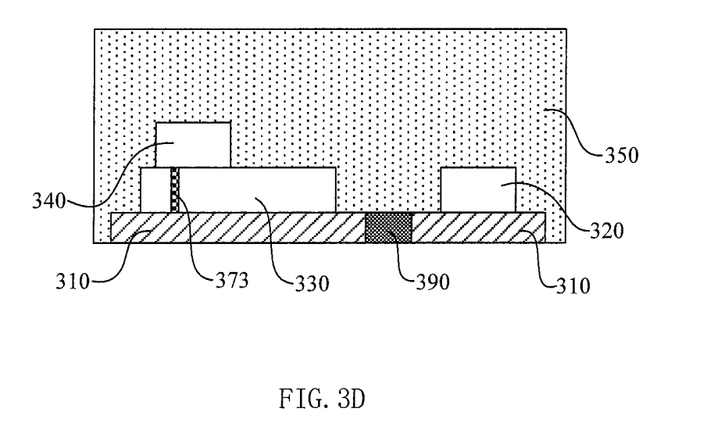
Figure 3E:
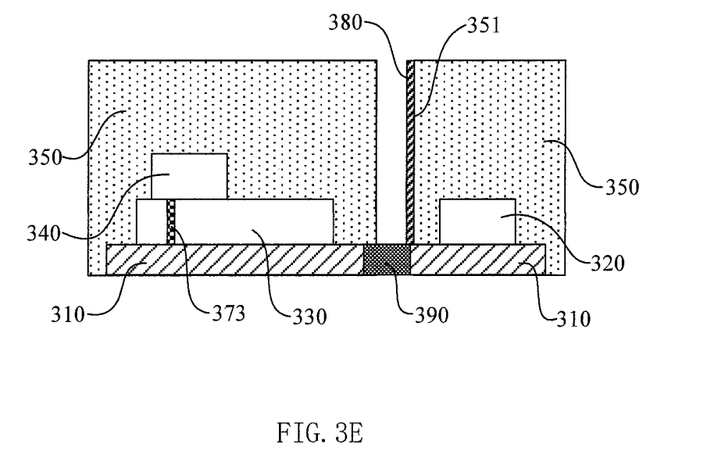

FIG. 3C to 3E are cross-sectional diagrams of the structure corresponding to various steps of a method for manufacturing the structure package according to the second embodiment. As referring to FIG. 3C, first, there is provided the lead frame 310 and the gaps between the inner pins of the lead frame 310 are filled with the third plastic body 390 which is made of the infrared cutoff materials, the infrared light emitter 320, the infrared light sensor 330 and the ambient light sensor 340 are provided on the lead frame 310, while the ambient light sensor 340 is mounted on the infrared light sensor 330, and their positions could be exchanged. The electrodes of the infrared light emitter 320 and the infrared light sensor 330 face the lead frame 310 and both are electrically coupled to the lead frame 310 by welding method, whereas the ambient light sensor 340 is electrically coupled to the lead frame 310 by the conductive vias 373 provided inside the infrared light sensor 330.

Next, as referring to FIG. 3D, the first plastic body 350 is formed. In the embodiment, the first plastic body 350 is made of transparent plastic materials for packaging, and covers the whole of the infrared light emitter 320, the infrared light sensor 330 and the ambient light sensor 340.

Next, as referring to FIG. 3E, the first plastic body 350 is cut to form a trench therein, the trench extends to the surface of the infrared light sensor 330, the first plastic body 350 is divided into a first portion for covering the infrared light sensor 320 and a second portion for covering the infrared light sensor 330 and the ambient light sensor 340, the first portion of the first plastic body 350 has a side surface 351 facing the infrared light sensor 330 and/or the ambient light sensor 340. Then, the light-blocking materials are sprayed on the side surface 351 to form the light-blocking layer 380. In the embodiment, the light-blocking layer 380 is an infrared light-blocking layer for blocking the infrared light to pass through. With this, the manufacturing process for the package structure according to the second embodiment is accomplished.

It should be noted that the above second embodiment can also be embodied in differently alternative manners.

In an alternative embodiment, a first filter film is provided on the ambient light sensing region of the ambient light sensor 340, the first filter film is an infrared cutoff filter film, so that the determination result of the ambient light sensor to the brightness of ambient light is close to the human eyes. The infrared light sensor 330 includes a second filter film provided on the infrared light sensing region and the second filter film only allows infrared light to pass through.

In another alternative embodiment, the first plastic body 350 has a first portion covering the infrared light emitter 320 and a second portion covering the infrared light sensor 330 and the ambient light sensor 340, the second portion has convex surfaces.

In another alternative embodiment, the materials of the first plastic body 350 are filled between the light-blocking layer 380 and the second portion of the first plastic body 350.

In another alternative embodiment, the lead frame 310 includes a package substrate including a first surface and a second surface. The first surface has conductive traces, i.e., inner pins. The conductive traces are coupled to the outer pins on the second surface of the package substrate via the conductive vias in the package substrate. The infrared light emitter, the infrared light sensor and ambient light sensor are electrically coupled to the conductive traces of the package substrate.

Figure 4A:
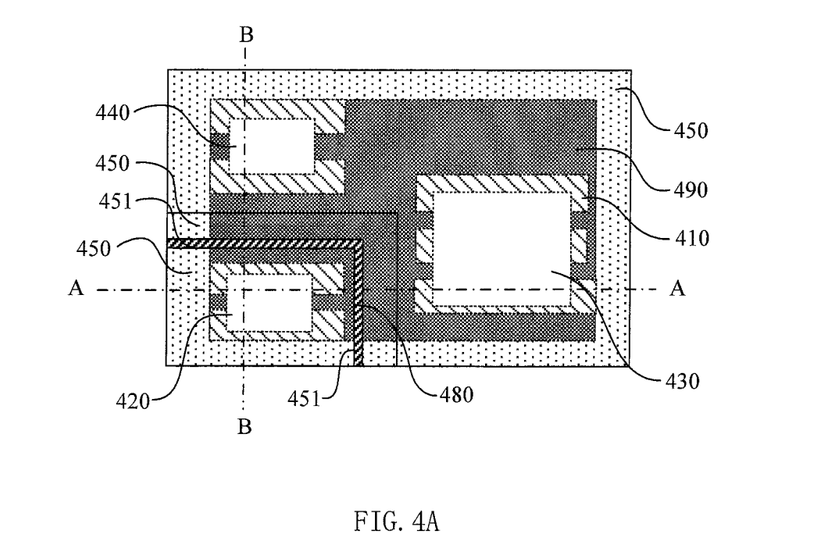
FIG. 4A to 4C are top diagrams and cross sectional diagrams of the package structure according to a third embodiment.
Figure 4B:
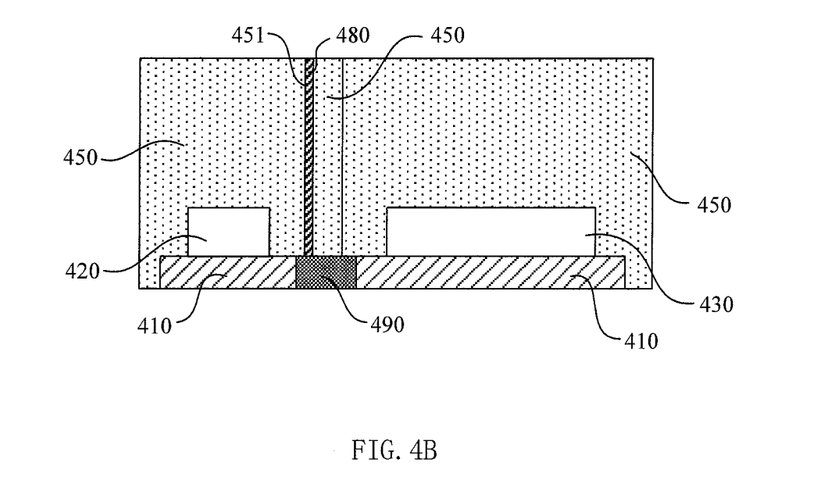
Figure 4C:
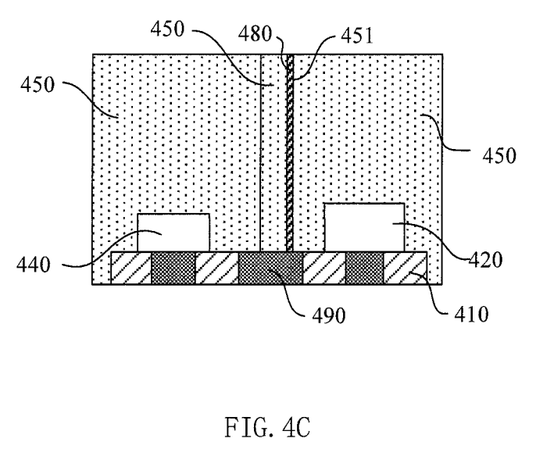

FIG. 4A to 4C are top diagrams and cross sectional diagrams of the package structure according to an third embodiment. FIG. 4A shows a top diagram of the embodiment, where the components, devices and connectors which are covered by a first plastic body 450, and an outline of a third plastic body 490, are represented by dash lines. Line AA in FIG. 4A shows the cut-out position of the sectional diagram shown in FIG. 4B, and line BB in FIG. 4B shows the cut-out position of the sectional diagram shown in FIG. 4C. The package structure according to the embodiment includes a lead frame 410, the lead frame 410 includes inner pins and there are gaps between the inner pins, the infrared cutoff materials of the third plastic body 490 are filled into the gaps between the inner pins, and the outer pins of the lead frame 410 are not shown. An infrared light emitter 420, an infrared light sensor 430 and an ambient light sensor 440 are provided on the lead frame 410, and three of them are electrically coupled to the lead frame 410 at a same level. The first plastic body 450 covers the infrared light emitter 420, the infrared light sensor 430 and the ambient light sensor 440, the portion of the first plastic body 450 covering the infrared light emitter 420 has a side surface 451 facing the infrared light sensor 430 and the ambient light sensor 440. It can be understood that if there are a larger number of light sensors which are located in different directions with respect to the light emitter, the portion of the first plastic body 450 covering the light emitter should correspondingly have a plurality of the side surfaces facing various light sensors. In the embodiment, the first plastic body 450 is made of transparent plastic materials for packaging. A light-blocking layer 480 is provided on the side surface 451 and the light-blocking layer 480 is an infrared light-blocking layer which blocks the infrared light to pass through.

The method for manufacturing the package structure according to the third embodiment and that according to the second embodiment are basically the same, and the difference between them are described below.

First, the lead frame 410 is provided to mount the infrared light emitter 420, the infrared light sensor 430 and the ambient light sensor 440, three of them have electrodes facing the lead frame 410 and are coupled to the lead frame 410 by welding the electrodes to the lead frame 410.

The subsequent processes, including plasticizing, cutting the first plastic body and spraying the light-blocking materials to form the light-blocking layer, are the same as the corresponding steps of the second embodiment, and will not be described in detail herein. The first plastic body 450 is cut to form a trench therein, the trench extends to the surface of the lead frame 410, the first plastic body 450 includes a first portion covering the infrared light emitter 420 and a second portion covering the infrared light sensor 430 and the ambient light sensor 440. Finally, the materials of the first plastic body 450 are filled between the light-blocking layer 480 and the second portion of the first plastic body 450, so as to form a more complete first plastic body 450. With this, the manufacturing process for the package structure according to the third embodiment is accomplished.

It should be noted that the infrared light sensor and the ambient light sensor according to the embodiments can exchange in their positions. Actually, the infrared light emitter may also be light emitting devices with other wavelengths. At that condition, the ambient light sensor, the infrared light sensor, the filter film located on their light sensing regions, the plastic materials, and the light-blocking materials of the light-blocking layer should be changed correspondingly.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element.

If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. A package structure, comprising:
a lead frame;
a first light sensor being electrically coupled to said lead frame;
a light emitter separated from said first light sensor and being electrically coupled to said lead frame;
a first plastic body which is a transparent plastic body, and configured to cover all or part of said first light sensor and said light emitter and have a trench therein;
a light-blocking layer located on a side surface of said first plastic body, wherein said first plastic body is divided by said trench into a first portion covering said light emitter and a second portion covering said first light sensor, said first portion of said first plastic body has said side surface facing said first light sensor; and
a second plastic body made of infrared cutoff materials, and configured to fill gaps between a plurality of inner pins of said lead frame or to be located below said lead frame.

2. The package structure according to claim 1, further comprising:
a second light sensor being electrically coupled to said lead frame.

3. The package structure according to claim 2, wherein said first light sensor is an ambient light sensor, on which an ambient light sensing region is provided to detect ambient light; and
said second light sensor is an infrared light sensor, on which an infrared light sensing region is provided to detect infrared light; and
said light emitter is an infrared light emitter.

4. The package structure according to claim 3, wherein said light-blocking layer is an infrared light-blocking layer that prevents infrared light from passing through.

5. The package structure according to claim 3, wherein a first filter film is provided on said ambient light sensing region of said ambient light sensor, which is an infrared cutoff filter film.

6. The package structure according to claim 3, wherein a second filter film is provided on said infrared light sensing region of said infrared light sensor, which allows only infrared light to pass through.

7. The package structure according to claim 3, wherein said first plastic body has convex surfaces on said ambient light sensor, on said infrared light sensor, and on said infrared light emitter.

8. The package structure according to claim 3,
wherein said second plastic body covers a portion of said infrared light sensor and exposes said infrared light sensing region.

9. The package structure according to claim 3, wherein said trench extends through said lead frame into said second plastic body, and said second light sensor is located below said lead frame and receives said infrared light through said trench.

10. The package structure according to claim 1, wherein said lead frame comprises:
said plurality of inner pins being coupled to said first light sensor and said light emitter; and
a plurality of outer pins being exposed outside said first plastic body.

11. The package structure according to claim 10, further comprising:
a third plastic body,
wherein there are gaps between said plurality of inner pins and said gaps are filled with said third plastic body.

12. A method for manufacturing a package structure, comprising:
providing a lead frame;
mounting a first light sensor and a light emitter, which are mounted separately but both are electrically coupled to said lead frame;
forming a first plastic body which is a transparent plastic body, and covers all or part of said first light sensor and said light emitter;
forming a trench in said first plastic body, wherein said first plastic body is divided by said trench into a first portion covering said light emitter and a second portion covering said first light sensor, said first portion of said first plastic body has a side surface facing said first light sensor;
forming a light light-blocking layer on said side surface; and
forming a second plastic body which is made of infrared cutoff materials, and fills inner pins of said lead frame or is formed below said lead frame.

13. The method according to claim 12, further comprising:
mounting a second light sensor being electrically coupled to said lead frame.

14. The method according to claim 13, wherein said second light sensor is mounted while said first light sensor and said light emitter are mounted.

15. The method according to claim 14, wherein said second light sensor is mounted on said first light sensor.

16. The method according to claim 15, wherein said electric coupling between said second light sensor and said lead frame is implemented by conductive vias provided on said first light sensor.

17. The method according to claim 13, wherein said electric coupling is implemented by coupling electrodes of said first light sensor or said second light sensor or said light emitter to inner pins of said lead frame via electric connectors.

18. The method according to claim 13, wherein said electric coupling is implemented by placing electrodes of said first light sensor or said second light sensor or said light emitter on inner pins of said lead frame and welding to said inner pins.

19. The method according to claim 12, wherein said second light sensor is mounted after said first plastic body is formed.

20. The method according to claim 19, wherein said second plastic body is formed covering said second light sensor after said second light sensor is mounted.

21. The method according to claim 20, wherein said trench extends through said lead frame into said second plastic body, and said second light sensor is located below said lead frame and receives said infrared light through said trench.

22. The method according to claim 12, wherein said step of forming said first plastic body comprises forming convex surfaces over said first light sensor and/or said light emitter.

23. The method according to claim 12, wherein said materials of said first plastic body are filled between said light-blocking layer and said second portion of first plastic body to form a complete first plastic body.

\* \* \* \* \*